United States Patent [19]

Weglin

[11] 4,053,348
[45] Oct. 11, 1977

[54] DIE AND METHOD OF MAKING THE SAME

[75] Inventor: Walter Weglin, Bellevue, Wash.

[73] Assignee: Jerobee Industries, Inc., Redmond, Wash.

[21] Appl. No.: 696,564

[22] Filed: June 16, 1976

[51] Int. Cl.² .......................... B32B 31/00; C23F 1/02
[52] U.S. Cl. ........................................ 156/515; 96/36; 156/251; 156/261; 156/645; 156/661; 156/659; 156/664; 156/905
[58] Field of Search ...................... 156/8, 11, 14, 6, 16, 156/18, 345, 251, 261, 515, 528; 96/36, 36.3

[56] References Cited

U.S. PATENT DOCUMENTS

| | | | |
|---|---|---|---|
| 2,321,740 | 6/1943 | Flint | 156/251 X |
| 2,753,619 | 7/1956 | Franklin | 156/251 X |
| 3,331,726 | 7/1967 | McGinley et al. | 156/510 |
| 3,661,577 | 5/1972 | Klemm et al. | 96/36 |
| 3,911,716 | 10/1975 | Weglin | 156/251 X |

Primary Examiner—William A. Powell
Attorney, Agent, or Firm—Graybeal, Barnard & Uhlir

[57] ABSTRACT

A high precision die particularly adapted to form from a relatively heavy foil sheet a circuit board where the individual circuit elements and the spacing thereof are of relatively small dimensions. The die is made as follows. A working surface of a die block is covered with a first protective overlay having an enlarged pattern corresponding to the pattern of the die elements to be formed, but enlarged by a substantially uniform width dimension. The surface is then exposed to an etching solution to remove material from the exposed areas. These two steps are repeated a second time with a pattern enlarged to a lesser degree, and again a third time to bring the die elements being formed from the die block within quite close tolerances to the original pattern. The die faces of the die elements are then etched to form knife edges on the die elements.

17 Claims, 24 Drawing Figures

DIE AND METHOD OF MAKING THE SAME

BACKGROUND OF THE INVENTION

1. Field of the Invention

This invention relates to a die and a method of making the die. The die is adapted to stamp out from metal foil, circuit elements of a circuit board pattern and simultaneously bond the circuit elements to a substrate. More particularly this is a high precision die capable of forming circuit boards from relatively thick foil sheets, with the width dimensions of the circuit elements and the spacings thereof being of relatively small dimensions.

2. Description of the Prior Art

In my earlier patent, U.S. Pat. No. 3,758,350, entitled "Method of Making a Die for Stamping Out Circuit Boards", there is disclosed a method of etching a die block to form an improved die particularly adapted for forming a relatively compact circuit board where the circuit elements are of relatively small width and with small separation therebetween. In that method, first there is formed a conventional flat face die, comprising flat face die elemnets with intervening recess areas, this being accomplished in a conventional manner. Then the recess areas are filled with an acid resisting epoxy, and a photo resist is applied over the epoxy in a manner to overlap the outer edge portions of the die elements so that the middle portion of each die element is exposed. The die is then exposed to an etching medium to form a die element recess in the middle portion of each die elements, with shoulders being formed along the edge portions of each die element. Next the acid resist material is removed, and with the recess filling epoxy still remaining the die surface is again etched for a short period of time. In one form, the final etching is done in a manner to provide "modified" die element edge portions where the inner edge surface of each die element edge portion is somewhat rounded, and in another embodiment, the final etching is accomplished in a manner to provide a knife edge die.

While the method described above has proven quite effective in making precision dies effective for high production manufacture of circuit boards, there is still a need for further improvement in the die making process. For many industrial applications it is desirable to have the elements of the circuit board made from a thicker foil sheet to enhance the reliability of the circuit elements being formed and their capability of handling higher current loads. Yet there is the continuing demand for yet greater compactness, which means making both the individual circuit elements and the separating areas between the elements of smaller width dimensions.

In a circuit board manufacturing operation, it is desirable to accomplish both the forming of the circuit elements from the foil sheet and the bonding of these circuit elements to a dielectric substrate in one stamping operation. This is usually accomplished by providing a thermo-adhesive coating between the foil sheet and the substrate and heating the die prior to the stamping operation. When the heated die is brought into engagement with the foil sheet, the die elements press into the foil sheet to separate the circuit elements from the foil sheet and press these into firm engagement with the substrate while heating the underlying adhesive layer to cause bonding of the circuit elements to the substrate. The excess foil adjacent the die elements do not become bonded to the substrate, and this excess foil is simply stripped away from the dielectric material after the die is moved away from the circuit board just formed.

However, when it is attempted to use heavier foils to make circuit boards where the width and spacing of the elements are still quite small, the problems of properly accomplishing this simultaneous forming and bonding of the circuit elements are greatly aggravated. First, with regard to the individual die element, the edge portions of each die element must be of a height sufficient to cause a separation through the entire thickness of the foil sheet. Secondly, the depth of the recess area of the die must be sufficient to permit the excess foil to become positioned in such recess area during the stamping operation, without the excess foil becoming bonded to the substrate. With regard to this problem of the unintended bonding of the excess foil, it is necessary to make a distinction between "background" areas of the die and "separating" areas of the die and of the circuit board being formed. The "separating" areas are those existing between two adjacent circuit elements, and with the type of circuit boards being considered herein, these separating areas are in the order of fifteen to fifty thousandths of an inch in width. The "background" areas are those of substantially greater dimensions that separate groups of circuit elements being formed. Both the separating areas of the die and the background areas must be recessed to a depth sufficient to accommodate the excess foil. But in the background areas there is need for yet greater depth because of a tendency of the larger pieces of excess foil to buckle or bend during the stamping process and thus cause unintended bonding of this excess foil to the substrate during the stamping operation.

When it is attempted to employ etching techniques to achieve greater depth in the recess areas being formed, the problems in maintaining a high degree of precision, particularly with respect to adhering to a preselected pattern within relatively close tolerances, are substantially aggravated. When a resist pattern is applied to the surface of a die block and the etching solution is applied to the surface, the etching solution tends to work not only downwardly in the exposed areas, but also laterally to "undercut" the material beneath the resist pattern. However, the degree of such undercutting is by no means always uniform. First, impurities or lack of uniformity in the material being etched (e.g. carbon particles in steel) can impede the progress of the etching medium in certain areas. Second, the resist material that overhangs the undercut may break away in certain areas, with the result that the undercut areas with the more exposure etch away at a faster rate than those areas where the existing overhang impedes access of the etching medium to the material just below the resist pattern. Thus, there is a tendency for the final configuration of the die elements to have "strayed" from the pattern of the original art work according to which the die is to be formed.

It can be appreciated that this problem becomes especially critical when it is attempted to form the edge portions of the individual die elements within quite close tolerances (e.g. a thousandth of an inch or less) so that these can properly perform their function of separating the quite small circuit elements from the foil, which may be as small as ten thousandths of an inch wide. Not only is this precision of importance in the initial formation of the die, but also with regard to future maintenance of the die. As the edge portions of the individual die elements become worn, resharpening becomes necessary, and with the very small dimensions involved, this resharpening can best be accomplished by means of etching. Such resharpening can only be accomplished properly if the initial formation of the circuit elements is within proper tolerances.

In view of the foregoing, it is an object of the present invention to provide an improved die and a method of making a die within very close tolerances, which die is particularly adapted for forming a circuit board from relatively thick foil, with the width dimensions and spacing of the circuit elements being of a relatively small dimension.

SUMMARY OF THE INVENTION

The preferred form of the present invention provides a precision die and a method of making the same, said die being particularly adapted to form from a heavy foil sheet a circuit board comprising a plurality of circuit elements corresponding within close tolerances to a preselected base pattern of pattern figures, each with delineating edge lines. The pattern has separating areas which separate relatively closely spaced circuit elements and at least one background area of a relatively larger width dimension that separates more widely spaced circuit elements or groups of circuit elements. The die has die elements adapted to engage the foil to form the circuit elements therefrom, with each of the die elements having a surface area with edge portions corresponding closely to edge lines of a related pattern figure, and side walls leading from its edge portions into adjacent recesses on opposite sides of the die element.

In the method of the present invention, there is first provided a die block having a working face at which the die elements are to be formed. To perform certain etching operations on this die block, there are made a plurality of modified overlay patterns, each of which has a pattern base area corresponding in configuration to the original base pattern, and an enlarged area portion extending beyond the delineating edge lines of the base pattern by a predetermined substantially uniform width dimension. In the preferred form, these overlay patterns comprise:

a. a first background pattern, having an enlarged edge portion of a greater width which is less than half the width dimension of the related background area, b. a second separating overlay pattern having an enlarged edge portion of an intermediate width which is less than half the spacing of closely spaced circuit elements, and c. a third truing overlay pattern having an enlarged edge portion of a relatively small width dimension corresponding quite closely to the base pattern.

The die block is then subjected to three etching operations, using in sequence protective overlays corresponding to the three patterns noted above. A first protective overlay corresponding to the first background pattern is applied to the face of the die block, and the die block is then exposed to an etching medium to form a recessed area at least at the background area and provide a first relief area including the portion of the die block in which the die elements are to be formed.

The working face of the die block is then covered with a second protective overlay corresponding to the second overlay pattern to expose a greater portion of the background area and also expose at least a portion of the separating areas in the die block. The face of the die block is again exposed to an etching medium to remove further material from the background area and also to form recesses at the separating areas at the die block.

For the third etching operation, the working face of the die is covered with a third overlay corresponding to the third truing pattern. This protects the areas of the die at which the circuit elements are to be finally formed and also extends moderately beyond the edge portions thereof. The working face of the die is then exposed to an etching medium for a third time to form the die elements to a configuration corresponding quite closely to the preselected base pattern. In some instances it is possible to leave out the background etch and proceed initially from the intermediate etch to the truing etch.

Next the surface area of the individual die elements are formed each with a middle recess to leave upstanding foil engaging edge portions of the die elements. Desirably, this is accomplished in the same manner as disclosed in my earlier patent, U.S. Pat. No. 3,758,350. To described this briefly, the recesses between the die elements are filled with a protective material, such as epoxy resin, and then the working faces of the die elements are exposed to an etching medium to form the middle recess and provide upstanding edge portions adjacent to the protective material placed in the recesses. In the preferred form, this is accomplished in a two-stage etching process, where a protective overlay is applied over the edge surface portions of the individual die elements, after which a first etch is accomplished. Then the protective coating is removed, and the exposed surfaces of the die elements are exposed to an etching medium a second time to remove further material from the upstanding edge portions to form a foil engaging edges of the die element.

The die of the present invention is particularly adapted to form from a relatively heavy foil sheet a plurality of individual circuit elements and simultaneously bond these elements to a dielectric substrate. The circuit elements correspond within quite close tolerances to a preselected base pattern. This die comprises a plurality of die elements each of which has a foil engaging surface area with upstanding foil engaging edge portions corresponding to edge lines of the circuit elements being formed.

Some of the die elements are spaced quite closely together and have "separating recesses" corresponding in location to the separating areas of the base pattern. The die also has at least one background recess corresponding in location to the background area of the base pattern. The depth of the background recess is greater than that of the separating recesses. Thus, when the die is pressed against the foil sheet to form the circuit board, excess foil at the separating recess areas is able to be located in those recess areas without becoming bonded to the substrate, and excess foil at the background area is able to become located in the background recess without becoming bonded to the substrate.

Each of the die elements has side walls defining the adjacent recesses, and in the preferred form these side walls are of substantially uniform slope. Thus, when the upstanding edge portions of the die elements are sharpened by means of an etching operation, the etching is more uniform so that the sharpened edge portions of the die element are of a substantially uniform height.

Within the broader scope of the present invention, there is provided a method of making a precision die having die elements corresponding within close tolerances to a preselected base pattern. Broadly, this method comprises providing a plurality of modified overlay patterns, each of which has a pattern area made up of base area corresponding in configuration to the base pattern and having an enlarged edge portion extending beyond the delineating edge lines of the base pattern by a predetermined uniform width dimension. There are at least two such overlay patterns comprising at least a first overlay pattern having an enlarged edge portion of a greater width, and a second overlay pattern having an enlarged edge portion of a lesser width corresponding more closely to the base pattern.

The working face of the die block is covered with a first protective overlay corresponding to the first overlay pattern to protect the working face portion of the die block beneath the pattern area of the first overlay pattern and leaving the remaining area exposed. The working face of the die is then exposed to an etching medium to form a recessed area at the exposed portion of the working face to the die and to provide a first relief area corresponding generally to the first overlay pattern. Then the working face of the die is covered with the second protective overlay corresponding to the second overlay pattern to protect that portion of the first relief area beneath the pattern area of the second protective overlay and leave a second remaining area exposed. The working face of the die is again exposed to an etching medium to remove material from the die block and cause the relief area to be further formed in a configuration of die elements corresponding more closely to the pattern figures of the base pattern according to which the die was formed.

Other features of the invention will become apparent from the following detailed description.

DESCRIPTION OF THE PREFERRED EMBODIMENT

Figure 1:
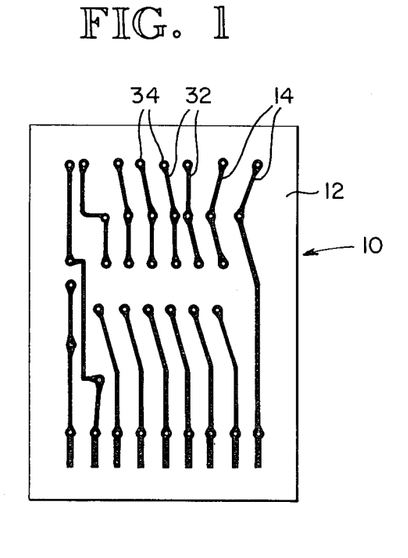
FIG. 1 is a plan view of original art work used as the base pattern in the method of the present invention.
Figure 2:
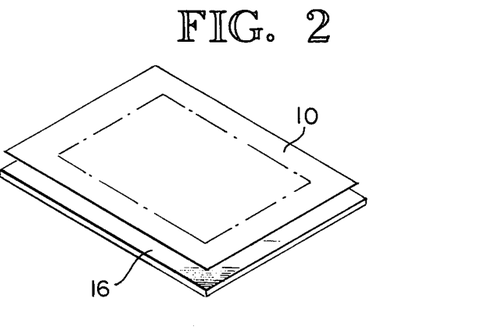
FIG. 2 is an isometric view of the art work being applied to a glass plate having a photographic emulsion thereon.

In FIG. 1 there is shown in plan view typical art work for a printed circuit board to be manufactured by a die made according to the process of the present invention. This art work 10 comprises a transparent sheet 12 on which is drawn a pattern of solid opaque FIG. 14 which are an accurate representation of the circuit elements of the circuit board to be manufactured as the end product. The FIG. 14 should be drawn within the engineering tolerances (e.g. plus or minus three thousandths of an inch) desired for the end product.

a. Preparation of Overlay Patterns

Prior to the actual physical operations of forming the die from a die block, there are the preliminary steps of providing a set of overlay patterns for subsequent etching operations. These will now be described with reference to FIGS. 2 through 8.

Figure 3:
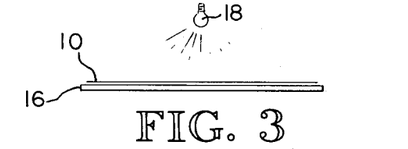
FIG. 3 is a side view showing the lay up of FIG. 2 being exposed to a light source to make a reproduction thereof.
Figure 4:
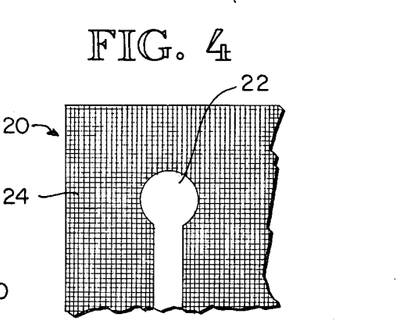
FIG. 4 is a plan view of a portion of the negative resulting from the step of FIG. 3, drawn to an enlarged scale; p

The first step is to prepare a negative from the art work 10 shown in FIG. 1. The art work 10 is placed onto a glass plate 16 having a photographic emulsion on one surface thereof. For accurate reproduction, the side of the art work 10 on which the FIG. 14 are drawn should be placed directly against the glass plate surface having the emulson thereon. Next, as shown in FIG. 3, light is directed from a source 18 through the art work 10 against the emulsion on the glass plate 16. The emulsion on the glass plate is then developed according to conventional photographic techniques to provide a negative image of the art work 10. A portion of such a negative image is shown at 20 in FIG. 4 where the circuit element image 22 appears as a transparency with an opaque surrounding area 24.

Figure 5:
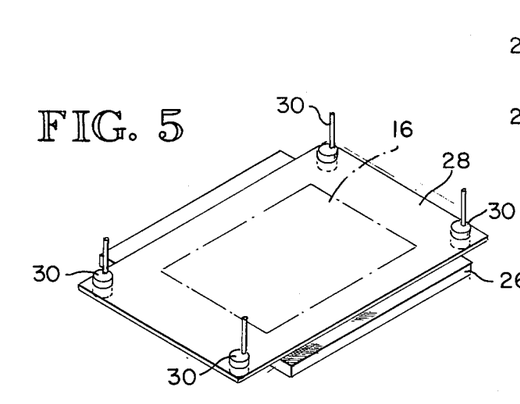
FIG. 5 is an isometric view of an apparatus by which modified overlay patterns are made from the negative pattern shown in FIG. 4.
Figures 6, 7:
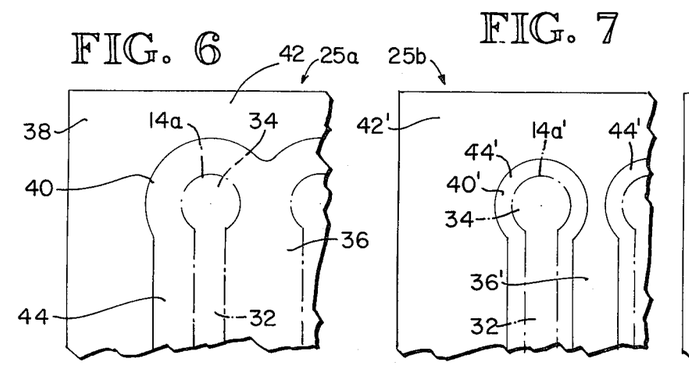
FIGS. 6, 7 and 8 are plan views, drawn to an enlarged scale, of three "enlarged" patterns prepared by the apparatus of FIG. 5.
Figure 8:
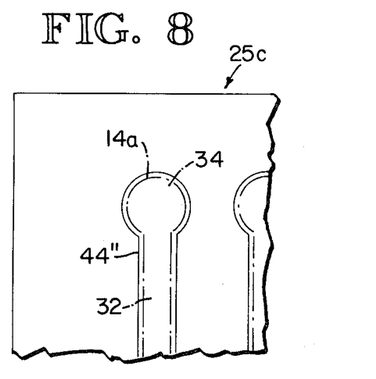
Figure 9:
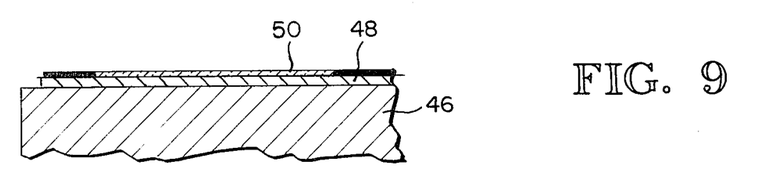
FIGS. 9 through 23 are sectional views of a portion of a die block which is subjected to the process of the present invention to make a finished die.
Figure 10:
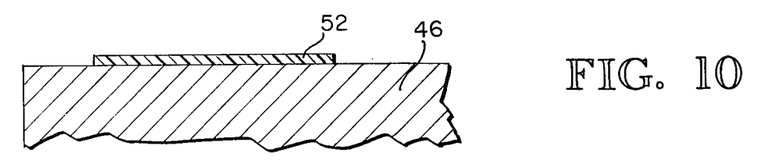

The glass plate negative reproduction 16 is then used to make a series of three overlay patterns, shown at 25a, 25b, and 25c in, respectively, FIGS. 6, 7 and 8, which patterns are modified reproductions of the art work 10. The apparatus used to accomplish this is shown in FIG. 5 and is described in my earlier patent, U.S. Pat. No. 3,758,350, mentioned above. A photographic film is placed on a base plate 26 and the blass plate 16 is mounted to an upper frame 28, with the emulsion face of the glass plate 16 facing downwardly so as to be against the photographic film on the base plate 26. The frame 28 is mounted to a set of four rotatable eccentrics 30 which when rotated in unison give the frame 28 a circular wobbling motion while maintaining the same orientation of the frame 28 and the glass plate 16 attached thereto. A light source is directed downwardly on the frame 28 and plate 16.

Since the image on the glass place 16 is a negative of the art work 10 so that the FIG. 14 appear as transparencies, the wobbling motion imparted to the plate 16 expands or widens the image of each of the FIG. 14 by an edge width increment equal to the radius of wobble of the eccentrics 30 to produce an "enlarged" or "widened" pattern. As can be seen by an examination of FIGS. 6, 7 and 8, where portions of three such patterns are shown to an enlarged scale, eccentrics of three different radii are used. To produce the pattern 25a of FIG. 6, eccentrics 30 of relatively large radii are used (in the order of thirty thousandths of an inch); to produce the pattern 25b of FIG. 7, eccentrics of substantially lesser radii are used (in the ordr of ten thousandths of an inch); and finally, to produce the pattern 25c of FIG. 8, eccentrics 30 of quite small radii are used (in the order of three to four thousandths of an inch).

For purposes of analysis, in each of the patterns 25a, b and c, the pattern of the original art work which can be considered the "base pattern", is indicated in broken lines at 14a. Each FIG. 14 (indicated in FIGS. 6, 7 and 8 as 14a) has a strip portion 32 and a terminal pad portion 34. For the sake of example, let it be assumed that the total width dimension of the strip portion 32 is approximately fifteen thousandths inch and that the minimum spacing between the strip portion 32 of two FIG. 14 is thirty thousandths of an inch. In the final circuit board to be manufactured, the insulating area between two adjacent conducting strips (i.e. the "separating" area) corresponds to the area indicated at 36 between the two FIG. 14a of FIGS. 6, 7 and 8. In addition, there is indicated in FIG. 6 the "background" area 38 which is an area of substantially greater width dimension existing between two spaced groups of FIG. 14.

To examine specifically the overlay pattern of FIG. 6, there is an opaque area 40 and a transparent area 42. The opaque area 40 includes the base pattern area 14a corresponding to each of the FIG. 14 of the original art work 10 shown in FIG. 1. In addition there is for each area 14a an enlarged edge portion 44 which extends beyond the delineating edge line of the base figure area 14a by a substantially uniform width dimension. In the particular example of FIG. 6, this width dimension is thirty thousandths of an inch. With the spacing of the two figure areas 14a being less than sixty thousandths of an inch, the "separating" area between the FIG. 14a is completely covered by the opaque area 40 of the pattern 25a.

In the pattern 25b shown in FIG. 7, there is within the opaque area 40' the base pattern 14a' having an enlarged edge portion 44' of substantially smaller width than that of the pattern 25a of FIG. 6. This results in a portion of the separating area 36' between the two figure areas 14a' being part of the transparent area 42'.

Finally, in the pattern of FIG. 8, it can be seen that the enlarged edge portion 44" is of a relatively small width so that the over all pattern in FIG. 8 is nearly the same as that shown in FIG. 1, with the base FIG. 14a being enlarged just slightly in all width dimensions (e.g. several thousandths of an inch).

b. Etching the Recesses in the Die Block by Use of the Modified Patterns

The three overlay patterns 25a, b and c shown in FIGS. 6, 7 and 8 are used in a three step etching process as follows:

1. The background etch.
    The pattern of FIG. 6 is used to etch away material to form a recessed area in the background portion of the die to be formed.
2. The separating etch.
    The pattern of FIG. 7 is used to etch away material in the separating areas of the die to be formed so as to delineate roughly the individual die elements and cause further removal of the material in the background area.
3. The truing etch.
    The pattern of FIG. 8 is used to etch away material on the side walls of the die elements being formed to bring these into configuration corresponding quite closely to the original art work as shown in FIG. 1.

These three steps will now be described with reference to FIGS. 9 through 15. First, a die blank (i.e. a rectangular block of material 46 made of a suitable metal, such as low carbon steel or an air-hardening or oil-hardening steel) is machined to provide a flat face which is to be the die face. This face is cleaned with pumice and water and then etched for a short period of time with a suitable solution (e.g. ferric chloride) to give a roughness to hold a photo resist material and then cleaned once again with pumice and water and air dried. Then a photo resist material 48 (e.g. KMER, which is Kodak Metal X Resist) is diluted and applied to the die surface in a layer between about 0.0005 and 0.001 inch thick. It is air dried for about 10 minutes and then baked in an oven at 250° F. for about a half hour and air cooled. This is done in a room using yellow safety lighting.

Next a negative 50 of the first enlarged pattern 25a shown in FIG. 6 is placed on top of the photo resist 48. The transparent portions of the negative correspond to the enlarged FIGURE area 40, and the opaque portions of the negative correspond to the background area 38. A light source is directed onto the negative to harden the exposed portions of the resist 48. The die block 46 is then placed in a resist developing solution for about a minute to wash away the undeveloped areas of the resist, and then is rinsed in water to remove the developer. The result is an acid resist overlay which covers an area corresponding to the base pattern area 14a and the enlarged edge portion area 44 of the pattern 25a of FIG. 6, and leaves exposed the background area 38. A portion of this overlay is indicated at 52 in FIG. 10.

Figures 11, 12, 13:
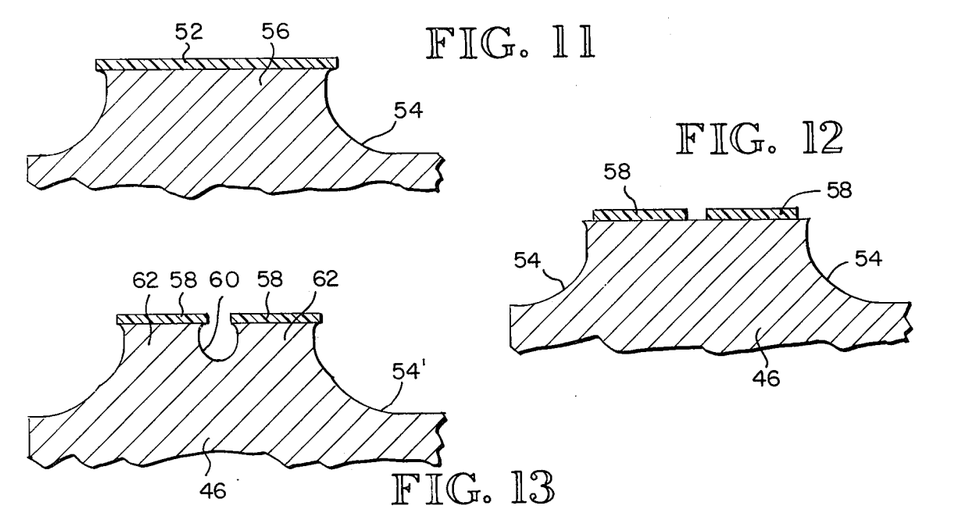
Figure 14:
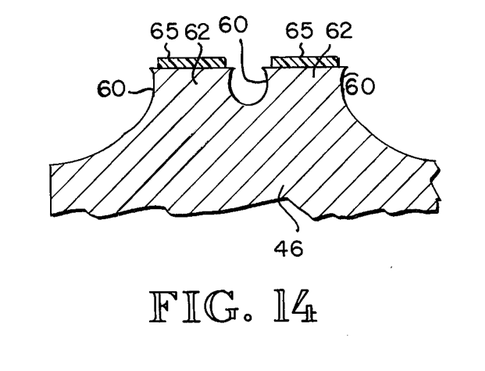

The die block 46 with the pattern overlay 52 thereon is placed in an etching machine which splashes acid onto the die face. In the particular example disclosed herein, where the width enlargement of the base pattern is thirty thousandth inch, the etching would be continued for approximately sixteen minutes to etch to a depth of approximately twenty thousandths inch and undercut laterally beneath the acid resist overlay approximately ten thousandth inch. For best results, this sixteen minute etch period should be accomplished in short segments of 40 seconds, with the die block 46 being removed from the etcher and the etched areas being brushed with a soft brush to remove any impurities or particles of carbon which might impede the etching rate in small areas. The resulting configuration of the die block 46 after this first "background" etch is illustrated in FIG. 11. There is a recessed area 54 corresponding generally to the background area 38 of the pattern 25a of FIG. 6. The area under the overlay pattern 52 is a relief area 56 corresponding generally to the enlarged pattern area 40 of the overlay pattern 25a of FIG. 6.

Next the die block is subjected to a second etching step, which is the "separating" etch. This is accomplished in substantially the same manner as the initial background etch, described above with reference to FIGS. 9 through 11. As shown in FIG. 12, there is applied to the etched surface of the die block 46 an acid resist overlay corresponding to the second overlay pattern 25b, shown in FIG. 7. This is accomplished by first applying a uniform resist coating, placing a negative immage of the second overlay pattern 25b over the resist coating, directing a light source on the exposed resist areas to cause these to harden, and washing away the undeveloped areas. On that portion of the die block 46 shown in FIG. 12, the resulting overlay pattern is shown as two overlay resist sections 58 corresponding to the pattern areas 44' shown in FIG. 7.

The working face of the die block 46 is again exposed to an etching solution, in much the same manner as the etching step described immediately above, for a period of about 10 minutes. The result is that the background recess area 54 is made about thirteen thousandths of an inch deeper, as indicated at 54' in FIG. 13 and the separating recesses are also formed in the die block 46 to a depth of about thirteen thousandths of an inch. (As indicated previously herein, the separating area is that which divides adjacent circuit elements, and the separating recess is an area of the die block 46 corresponding to such separating area in the circuit board to be formed. The separating recess shown in FIG. 13 in this intermediate stage is designated 60, and it can be seen that this recess 60 separates the previously formed relief area 56 of FIG. 11 into two relief elements 62 corresponding generally to the configuration of the die elements ultimately to be formed.)

Figure 15:
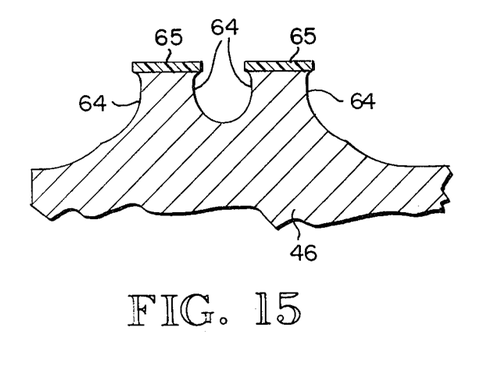
Figure 16:
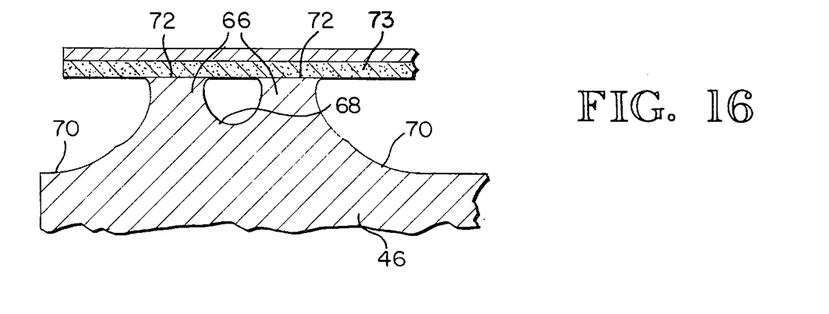

The third etching step (i.e. the "truing" etch) is now performed in much the same manner as the previous two etching steps. To accomplish this truing etch, the acid resisting overlay 65 is applied to accordance with the overlay pattern 25c shown in FIG. 8. The die block 46 is then etched for a somewhat shorter period of time (e.g. six minutes) which is closely controlled to bring the side walls 64 of the two elements 62 to a configuration corresponding quite closely to the original art work shown in FIG. 1. The side walls so formed after this truing etch are shown in FIG. 15 and designated 64. In this truing etch there is of course further deepening of the previously formed recesses 60 and 54.

c. Forming the Individual Die Elements With Raised Edge Portions and a Recessed Middle Portion The configuration of the die block 46 resulting from the etching steps described above has a portion thereof shown in FIG. 16. In FIG. 16, there are shown two die elements 66 spaced one from another by a separating recess 68, with two background recesses 70 on opposite sides of the two elements 66. Each die element 66 has a flat die surface 72 which lies in substantially the same place as the original working face of the die block 46. The configuration of the die faces 72 corresponds within very close tolerances to the configuration of the base pattern 14a, which in turn corresponds to the original art work 10 shown in FIG. 1.

It is now necessary to remove material from each of the die elements 66 at the middle area of the surfaces 72 to provide raised edge portions, which in the preferred embodiment described herein are knife edges. The steps by which this is accomplished are described herein with reference to FIGS. 16 through 24. Since this same sequence of steps is described in my earlier patent, U.S. Pat. No. 3,758,350, mentioned above, these steps will be described only briefly herein.

First, the surfaces 72 of the die elements 66 are ground down a thousandth of an inch or so to provide a good working surface and eliminate any "hook" that might have developed at the edge of each surface 72 as a result of the last etching operation. A grinding instrument is shown schematically in FIG. 16 at 73.

Figure 17:
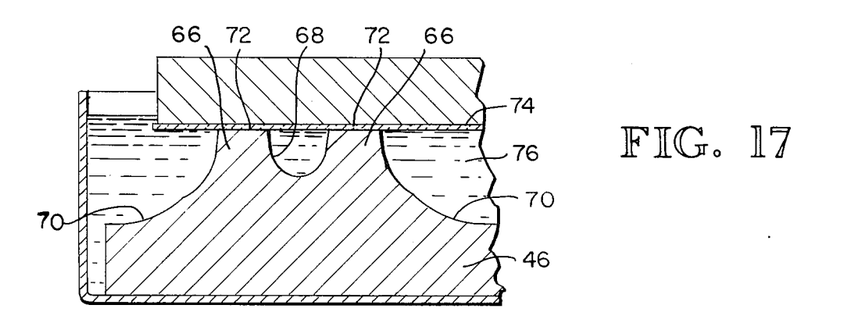

Next, as shown in FIG. 17, a very accurate reproduction of the surfaces 72 of the die elements 66 is made. This is done by placing the die block 46 face up in a container of conventional photographic developing solution 76, and a fully developed photographic glass plate 74 is pressed againt the die block 46 so that the die element surfaces 72 come into intimate contact with the photographic glass plate 74 while the developing solution 76 comes into contact with the recessed areas 70 and 68. This contact is maintained for a time sufficient (e.g. one minute) to cause the portions of the photographic glass plate in contact with the developing solution 52 to become developed. Then the photographic glass plate 74 is removed from the developing solution 76 and immediately rinsed in water to remove the developing solution, after which the photographic glass plate 74 is placed in a fixer solution for about two minutes. The result is a negative that is an accurate reproduction of the surfaces 72 of the die elements 66.

The next step is to make a "modified reproduction" of the die element pattern impressed on the photographic glass plate 74. This is accomplished by use of the apparatus shown in FIG. 5. However, the method of making this modified reproduction differs from that described with respect to FIGS. 6, 7 and 8 earlier herein, in that a positive of the pattern impressed on the photographic glass plate 74 is first prepared and then mounted to the frame 28. The result is a modified pattern where the edge portions of the image of the die surfaces 72 are reduced in width.

Figure 18:
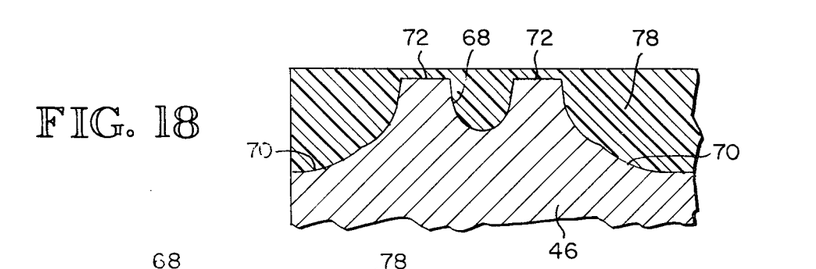
Figure 19:
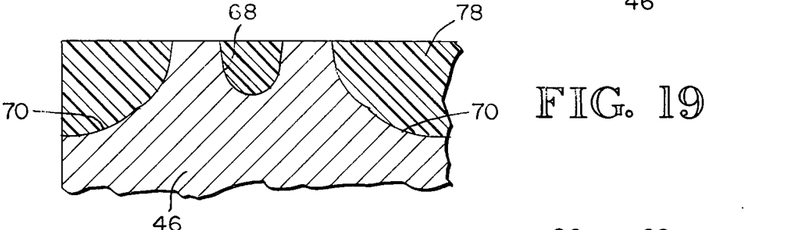
Figure 20:
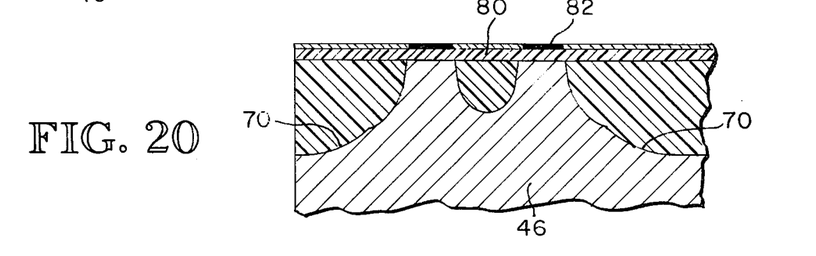

Next, the die recesses 68 and 70 are filled with an etch-resistant epoxy filler 78, such as E-Pox-E glue made by Woodhill Chemical Sales Corporation, of Cleveland, Ohio. The expoxy is applied by hand with a spatula to a level slightly above the die face, as shown in FIG. 18, to permit air bubbles to rise above the die element. After the epoxy has hardened, the epoxy layer is ground down to the level of the surfaces 72 of the die elements 66, as shown in FIG. 19.

Then, an acid resist 80 is applied to the surface of the die, and the modified pattern overlay, indicated at 82, prepared from the photographic reproduction 74 by use of the apparatus fo FIG. 5, is placed over the resist coating 80. Light is directed onto the pattern overlay 80 to develop the exposed portions of the resist 80, and the undeveloped portions of the resist 80 are washed away to leave the resist pattern 84 such as that shown in FIG. 21. This resist pattern 84 has portions 86 which overlap the edge portions of the die element surfaces 72, while leaving the middle of the surfaces 72 exposed.

Figures 21, 22:
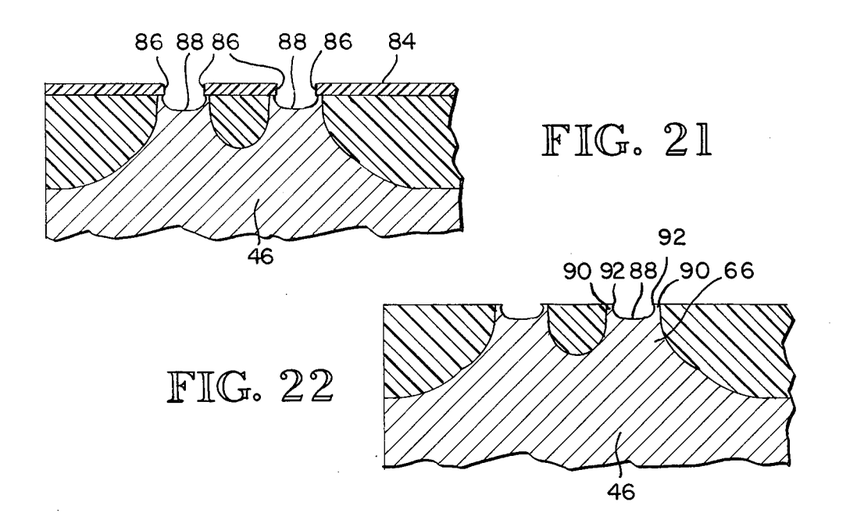
Figure 23:
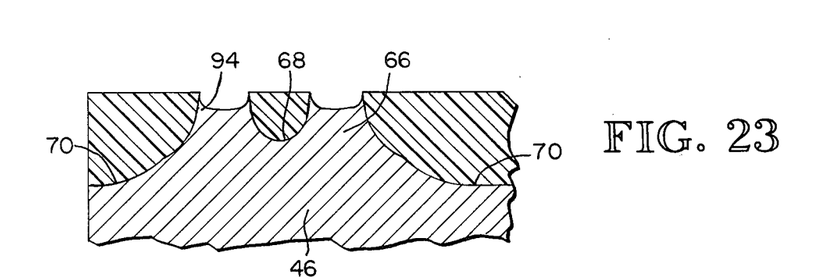

The die block 46 with the modified resist pattern 84 is then baked and etched in substantially the same manner as described above. An etching solution is splashed onto the exposed faces 72 to etch a recess 88 to a depth of about 0.006 inch, as shown in FIG. 21. Again, this can be accomplished in short time increments, with intermediate cleaning by means of a soft brush. The pattern resist 84 is then removed, and the resulting configuration is that shown in FIG. 22. Each die element 66 has a center recess 88 and two upstanding shoulder portions 90. Each shoulder has a slight "hook" on its interior edge, as at 92, due to the undercutting of the etching solution under the overlap areas 86 of the resist pattern 84.

Next, the die block 46, with the epoxy 78 still filling the recesses 68 and 70 (as shown in FIG. 22) is exposed to an etching solution for a short period of time to further deepen the die element cavities 88 and etch laterally into the shoulder portions 90. Since the etching solution tends to work more vigorously on exposed corner portions (such as the area at the "hook" 92 of each shoulder 90) the resulting configuration are two upstanding knife edges, as shown at 94 in FIG. 23. The epoxy filler 78 is then removed. This can be accomplished quite simply by heating the die 66 to make the epoxy 78 soft, and it is peeled out of the various cavities 68 and 70 with the assist of a scribe.

Figure 24:
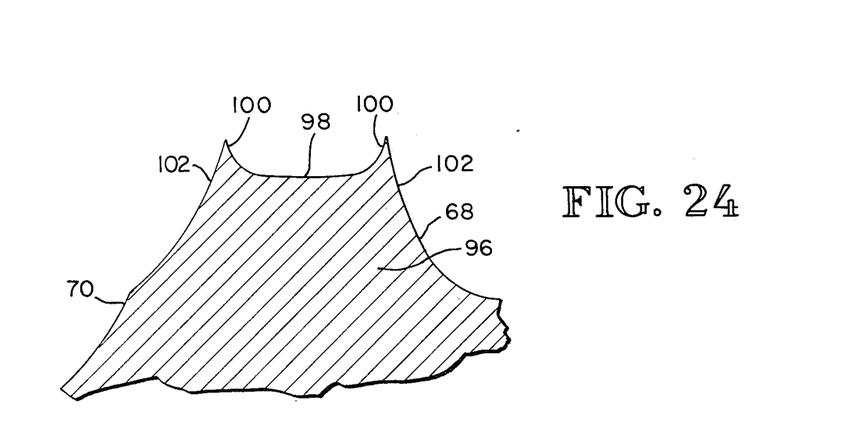
FIG. 24 is a sectional view of one die element, drawn to a further enlarged scale, of a die made according to the method of the present invention.

A die element 96 of the finished die of the present invention is shown in FIG. 24. It can be seen that the die element 96 has a die face area comprising a middle recess 98 and the two upstanding knife edges 100. Extending downwardly from the two knife edges 100 are the two side walls 102 of the die element 96. The upper portion of the surfaces 102 are nearly perpendicular to the plane of the surface of the die, and the two surfaces 102 curve downwardly and outwardly to a moderate degree to result in a moderately decreasing slope in a downward direction.

The slope of these two side walls 102 are substantially symmetrical, which greatly enhances the ability of the die element 96 to be sharpened. With the very small dimensions involved, it is almost impossible to sharpen the knife edges by any sort of mechanical operation. Rather, this sharpening can best be accomplished by etching, somewhat in the same manner as the etching step described with reference to FIG. 22 above. The cavities adjacent the die elements are filled with an epoxy to the level of the top edge of the knife edges 94, and the die is then exposed to an etching solution for a short period. If the slope of the side walls 102 were not substantially symmetrical, there would be a tendency for the etching solution to work through the knife edges 100 laterally in a manner to produce an uneven cutting edge. However, with the slopes 102 being substantially uniform, the sharpening can be accomplished in a manner that the height of the knife edges remain substantially uniform. Further the background recesses 70 are at a depth greater than the separating recess 68. During the circuit board forming process, this permits the excess foil in the background areas to fold into the recesses 70 without becoming bonded to the substrate of the circuit board being formed.

To review the over-all process of the present invention, the first three etching steps described with respect to FIGS. 9-15 serve the function of providing flat face die elements 66 which correspond very closely to the pattern of the original art work, and with the configuration of the side walls of the die elements 66 being quite uniform with respect to slope. This results in several advantages. First, with the assurance of being able to reproduce the pattern of the art work onto the die elements within very close tolerances, the spacing of the circuit elements can be made quite close to the minimum desired dimension of separation. Further, the precision within which the top surface and side walls of each die element are made enables the formation of the knife edges on the die element of a height greater than would normally be achieved, while maintaining the evenness of such knife edges within close tolerances. Thirdly, as mentioned above, the sharpening of the edges of the die elements can be better accomplished in a manner to maintain the evenness of the knife edges within close tolerances.

With regard to how this is accomplished in the present invention, the rate at which an etching solution etches into a surface depends upon the degree of exposure to the etching solution. Thus, an exposed exterior corner or protrusion etches away at a faster rate than a flat surface with normal exposure to the etching solution. Also, a somewhat protected surface area (such as that which exists beneath an overhanging portion of resist material) is etched away at a yet slower rate. It has been found that by using the sequential etching operation described herein, where the protective overlay pattern is applied to the surface of the die in an enlarged pattern and then brought in stages progressively closer to the original art work, the irregularities that might result from uneven etching during one portion of the etching process are substantially eliminated in the subsequent portion of the etching process. The end result is that it is possible to obtain relatively deep recess areas in the die, while maintaining very high precision in the die elements and uniformity in the slope of the side walls of the die elements.

It can be appreciated that the steps of the present invention can be modified for particular requirements. For example, where yet greater depth is needed for the die recesses, additional intermediate etching steps can be included in the process. Further, where somewhat less recess depth and/or precision in the end product is needed, it is possible to leave out the background etching step and go from the separating etch to the truing etch.

EXAMPLE I

A pattern of original art work was prepared substantially as described with respect to FIG. 1, with the individual elements being approximately fifteen thousandths inch in width, and the average spacing of adjacent elements being about fifteen thousandths inch. The width of the background areas of the art work was greater than 0.060 inch and up to one half inch. Three modified overlay patterns were made, as illustrated in FIGS. 6, 7 and 8. The larger pattern had enlarged edge portions of thirty thousandths inch. The intermediate modified pattern had an expanded edge width of ten thousandths inch. The third truing modified pattern had an edge enlargement of three thousandths inch.

A rectangular die block made of low carbon steel, 7 inches long, 6 inches wide, and three-fourths inch thick, was cleaned on one of its faces with ferric chloride, scrubbed with pumice and water, water rinsed and air dried. A photo resist material, Kodal KMER Brand, was applied to the die surface. The photo resist layer was air dried for ten minutes and then baked in an oven at 250° F. for thirty minutes and then air cooled. This was done in a room with yellow safety lighting. A negative prepared from the first larger overlay pattern was placed over the resist and a glass plate was placed on top of the negative to hold it in intimate contact with the resist. An arc lamp, positioned about 24 inches above the glass plate, was turned on to shine onto the negative for about thirty minutes. The die block with the resist material thereon was placed in a resist developing solution to wash away the undeveloped areas of the resist and was then rinsed in water. This provided an acid resist coating corresponding to the first expanded overlay pattern.

The sides and back of the die block were covered with masking tape, and the block was placed in a Master Model PC-32 etching machine, having an etching solution therein which is ferric chloride 35° Baume) (diluted with water from 42° Baume) etching solution made by Philip A. Hunt Chemical Corp. The plate was etched for 16 minutes to a depth of approximately twenty thousandths of an inch, and the undercut beneath the resist material was approximately ten thousandths of an inch. This etching was interrupted every 40 seconds, with the block being removed from the etcher, and the exposed etched surfaces being cleaned with a soft brush. The resulting configuration of the die block was such that those areas corresponding to closely adjacent groups of circuit elements on the original art work appeared as single relief areas, with those areas corresponding to the background areas of the original art work being recessed to a depth of about twenty thousandths inch.

Next, an acid resisting overlay was applied to the die surface in the same manner as described above, but using the second overlay pattern having a width enlargement of ten thousandths inch. With this protective overlay applied, the edge portions of the overlay were spaced inwardly from the edge of the relief areas approximately ten thousandths of an inch.

The die block was again exposed to an etching solution as described above for a period of approximately 10 minutes to etch to an additional depth of about thirteen thousandths of an inch. The resulting depth in the previously etched areas was approximately thirty-three thousandths of an inch, and the recesses formed between adjacent pattern elements was approximately thirteen thousandths of an inch. Th width of undercut beneath the edges of the pattern was approximately six thousandths of an inch.

A third etching operation was accomplished by means of the third modified overlay pattern. When this pattern was applied to the die block, the edge portions of the resulting overlay pattern were spaced inwardly from the edges of the relief areas only about a thousandth of an inch. The block was then etched for approximately 6 minutes, to bring the side walls of the relief areas to a configuration corresponding very closely to the original art work.

Next, the die block was ground with a surface grinding machine for flatness to remove about one thousandth of an inch of material on the face of the die block. A fully exposed photographic glass plate was immersed in a photographic developing solution, and pressed against the surface of the die, with the die block and the glass plate remaining in contact in the developing solution for one minute. The glass plate and block were removed from the developing solution, and the glass plate was immediately rinsed in cold water and placed in a photographic fix solution. The glass plate was kept in this fix solution for 2 minutes. This resulted in a negative which was an accurate reproduction of the surfaces of the die elements on the die block.

A positive was made from the negative, and the positive was placed over an unexposed photographic glass plate in the apparatus shown in FIG. 5. A circular wobbling motion was imparted to the plate holding the positive glass plate, with the radius of rotation of the eccentric being four thousandths of an inch. An ultra violet lamp placed 10 inches above the film was turned on for ten seconds, after which the photographic film was developed to make a negative of a modified die pattern. A positive was then made from this negative. The resulting pattern was one corresponding to the original art work, but with the individual figures corresponding to circuit elements being "skinnied" by about four thousandths of an inch along each edge.

Then an acid resist E-Pox-E Glue No. EPX-1 made by Woodhill Chemical Sales Corp, was applied to the die surface by hand with a spatula to a level slightly above the die face to permit bubbles to rise above the die element. The die surface was ground to remove the hardened epoxy down to the level of the die elements. An acid resist coating such as that indicated above was applied to the die face. The positive of the modified pattern was placed over the photo resist layer, and an ultra violet lamp above the photo resist layer was turned on to harden the exposed portions of the resist. The die, with the developed photo resist pattern thereon was placed in a resist developing solution to remove the unexposed areas of the resist.

The die blank with the modified resist pattern thereon was placed in an oven and baked for thirty minutes at 250° F. The block was then etched in the manner described above, and this etching was continued for 4 minutes. The die was removed from the etching solution, and the photographic coating was removed by grinding. The die was placed back into the etch solution for about 4 minutes. Then the die was placed on a hot plate and heated to 170° F. to soften the epoxy filler in the recess areas between the die elements, and a scribe was run through the recess areas to remove the epoxy therefrom. The result was a die having the background areas recessed to a depth of about forty thousandths of an inch, and separating areas recessed to approximately eighteen thousandths of an inch. Each die element had at its edge portion raised knife edges, and a recessed middle surfaced portion about five thousandths of an inch deep. The side walls of each die element adjacent the knife edge extended downwardly, and slanted slightly outwardly from the vertical. A comparison of the resulting die with the original art work indicated that the formation of the die elements was within about plus or minus two thousandths of an inch to the original art work.

What is claimed is:

1. A method of making a precision die particularly adapted to form from a foil sheet a circuit board comprising a plurality of circuit elements corresponding within close tolerances to a preselected base pattern of pattern figures with delineating edge lines, said pattern being characterized by having separating areas separating relatively closely spaced circuit elements and at least one background area of a larger width dimension separating more widely spaced circuit elements, said die having die element adapted to engage said foil to form the circuit elements therefrom, said die elements each having a surface area with edge portions corresponding closely to the edge lines of a related pattern figure, and side walls leading from its edge portions into adjacent recesses on opposite sides of the die element, said method comprising:

a. providing a die block having a working face at which the die elements are to be formed, b. providing a plurality of modified overlay patterns, each of which has a pattern area made up of a base area corresponding in configuration to the base pattern and having an enlarged edge portion extending beyond the delineating edge lines of the base pattern by a predetermined substantially uniform width dimension, said overlay patterns comprising a first background pattern, having an enlarged edge portion of a greater width which is less than half the width dimensions of the background area, a second separating overlay pattern having an enlarged edge portion of an intermediate width which is less than half the spacing of closely spaced circuit elements, and a third truing overlay pattern having an enlarged edge portion of a relatively small width corresponding quite closely to the base pattern, c. covering the working face of the die block with a first protective overlay corresponding to the first background pattern to leave at least a portion of the background area of the die exposed, d. exposing the working face of the die to an etching medium to form a recessed area at least at the background area and provide a first relief area including the area of the die block at which the circuit elements are to be formed, e. covering the working face of the die block with a second protective overlay corresponding to the second separating overlay pattern to leave exposed a greater portion of the background area and also expose at least a portion of separating areas of the die block, f. again exposing the working face of the die block to an etching medium to remove further material from the background area and to also form recesses at the separating areas of the die block, g. covering the working face of the die with a third protective overlay corresponding to the third truing pattern to protect the areas of the die at which the die elements are to be finally formed and extend moderately beyond the edge portions thereof, h. again exposing the working face of the die to an etching medium to form the die elements to a configuration corresponding quite closely to the preselected base pattern, and i. forming the surface areas of each of the dies with a middle recess to leave upstanding foil engaging edge portions of the die elements.

2. The method as recited in claim 1, wherein the first etching step is performed to provide the first relief area to a pattern moderately enlarged with respect to the second overlay pattern, said second protective overlay being applied to the working face of the die to leave exposed edge portions of the first relief area, and said second etching step being accomplished to provide moderately sloping recess defining surfaces on opposite sides of the die elements.

3. The method as recited in claim 2, wherein material is removed from the middle portions of the working faces of the die elements by filling the recesses between die elements with a protective material and then exposing the working faces of the die elements to an etching medium to provide at the edge portions of the die elements said raised foil engaging edge portions.

4. The method as recited in claim 1, wherein material is removed from the middle portions of the working faces of the die elements by filling the recesses between the die elements with a protective material and then exposing the working faces of the die elements to an etching medium to provide at the edge portions of the die elements said raised foil engaging edge portions.

5. The method as recited in claim 1, wherein said overlay patterns are provided by first making a negative of said base pattern, placing said negative over a radiation sensitive surface, subjecting said negative to a rotary wobbling motion, while directing radiation through said negative against said radiation sensitive surface, with said first overlay pattern being formed by imparting the rotary wobbling motion about a greater radius, the third overlay pattern being formed by imparting the rotary wobbling motion to the negative about a lesser radius, and the second overlay pattern being formed by imparting the rotary wobbling motion to the negative pattern about an intermediate radius.

6. A die made according to the method of claim 1, said die being particularly adapted to form from a foil sheet a plurality of individual circuit elements and simultaneously bond said elements to a substrate, said circuit corresponding within close tolerances to a preselected base pattern of pattern figures with delineating edge lines, said pattern being characterized by having separating areas separating relatively closely spaced circuit elements and at least one background area of a larger width dimension more widely spaced circuit elements, said die comprising:

a. a plurality of die elements, each of which has a foil engaging surface area with upstanding foil engaging edge portions corresponding to edge lines of the circuit elements being formed, b. some of said die elements being spaced closely adjacent to one another and having separating recesses corresponding in location to the separating areas of the base pattern, said separating recesses being of a lesser depth, an c. said die having a background recess of a greater depth corresponding in location to the background area of said base pattern, whereby when said die is pressed against said foil sheet to form a circuit board, excess foil at said recess areas is able to be located in said recess areas without becoming bonded to said substrate, and excess foil in said background area is able to become located in said background recess without becoming bonded to said substrate.

7. The die as recited in claim 6, wherein each of said die elements has recess defining side walls of a substantially uniform slope, whereby upstanding edge portions of the die elements can be sharpened by means of etching, so as to maintain said edge portions substantially uniform with respect to each other.

8. A die particularly adapted to form from a foil sheet a plurality of individual circuit elements and simultaneously bond said elements to a substrate, said circuit elements corresponding within close tolerances to a preselected base pattern of pattern figures with delineating edge lines, said pattern being characterized by having separating areas separating relatively closely spaced circuit elements and at least one background area of a larger width dimension separating more widely spaced circuit elements, said die comprising:

a. a plurality of die elements, each of which has a foil engaging surface area with upstanding foil engaging edge portions corresponding to edge lines of the circuit elements being formed, b. some of said die elements being spaced closely adjacent to one another and having separating recesses corresponding in location to the separating areas of the base patttern, said separating recesses being of a lesser depth, and c. said die having a background recess of a greater depth corresponding in location to the background area of said base pattern, whereby when said die is pressed against said foil sheet to form a circuit board, excess foil at said recess areas is able to be located in said recess areas without becoming bonded to said substrate, and excess foil in said background area is able to become located in said background recess without becoming bonded to said substrate.

9. The die as recited in claim 8, wherein each of said die elements has recess defining side walls of a substantially unifom slope, whereby upstanding edge portions of the die elements can be sharpened by means of etching, so as to maintain said edge portions substantially uniform with respect to each other.

10. A method of making a precision die having a plurality of die elements corresponding within close tolerances to a preselected base pattern of pattern figures with delineating edge lines, said die elements each having a surface area with edge portions corresponding closely to the edge lines of a related pattern figure, and side walls leading from its edge portion into recesses on opposite sides of the die element, said method comprising:

a. providing a die block having a working face at which the die elements are to be formed, b. providing a plurality of modified overlay patterns, each of which has a pattern area made up of a base area corresponding in configuration to the base pattern and having an enlarged edge portion extending beyond the delineating edge lines of the base pattern by a predetermined substantially uniform width dimension, said overlay patterns comprising at least a first and a second overlay pattern, with the first overlay pattern having an enlarged edge portion of a greater width, and the second overlay pattern having an enlarged edge portion of a lesser width corresponding more closely to said base pattern, c. covering the working face of the die block with a first protective overlay corresponding to the first overlay pattern to protect the working face portion of the die block beneath the pattern area of the first overlay pattern and leaving the remaining area exposed, d. exposing the working face of the die to an etching medium to form are recessed area at said remaining area and provide a first relief area corresponding generally to said first overlay pattern, e. covering the working face of the die block with a second protective overlay corresponding to the second overlay pattern to protect that portion of the relief area beneath the pattern area of the second protective overlay and leave a second remaining area exposed, f. again exposing the working face of the die to an etching medium to removed material from the die block at the exposed second remaining area to cause the relief area to be further formed in a configuration of die elements corresponding more closely to the pattern figures of the base pattern.

11. The method as recited in claim 10, wherein the first etching step is performed to provide a first relief area to a pattern moderately enlarged with respect to the second overlay pattern, and said second protective overlay is applied to the working face of the die to leave exposed edge portions of the first relief area, with said second etching step being accomplished to provide moderately sloping recess defining surfaces on opposite sides of the die elements.

12. The method as recited in claim 11, wherein material is removed from the middle portions of the working faces of the die elements by filling the recesses between die elements with a protective material and then exposing the working faces of the die elements to an etching medium to provide at the edge portions of the die elements raised foil engaging edge portions.

13. The method as recited in claim 10, wherein material is removed from the middle portions of the working faces of the die elements by filling the recesses between the die elements with a protective material and then exposing the working faces of the die elements to an etching medium to provide at the edge portions of the die elements raised foil engaging edge portions.

14. The method as recited in claim 10, wherein a third intermediate overlay pattern is provided, which intermdiate overlay pattern has an enlarged edge portion smaller than the first overlay pattern and larger than the second overlay pattern, and said intermediate overlay pattern is applied to the first relief area after which the working face of the die block is exposed to an etching medium prior to the step of covering the working face of the die block with said second protective overlay.

15. The method as recited in claim 14, wherein said second intermediate overlay pattern is applied to the working face of the die block to leave exposed edge portions of the first relief area.

16. The method as recited in claim 10, wherein said overlay patterns are provided by first making a negative of said base pattern, placing said negative over a radiation sensitive surface, subjecting said negative to a rotary wobbling motion, while directing radiation through said negative against said radiation sensitive surface, with said first overlay pattern being formed by imparting the rotary wobbling motion about a greater radius, and the second overlay pattern by imparting the rotary wobbling motion to the negative about a lesser radius.

17. The method as recited in claim 10, wherein there are provided three overlay patterns, namely said first pattern, said second pattern, and an intermediate overlay pattern having an enlarged edge portion of a width less than the first overlay pattern and greater than the second overlay pattern, and there are three etching steps where an etching medium is applied to the working face of the die element, namely the etching step after the application of the first overlay pattern, the second etching step performed after the application of the protective overlay corresponding to the second overlay pattern, and an intermediate etching step performed between the first and second etching steps and after the application of the protective overlay corresponding to the intermediate overlay pattern.

* * * * *